(12) United States Patent  
Watanabe

(10) Patent No.: US 7,649,499 B2
(45) Date of Patent: Jan. 19, 2010

(54) HIGH-FREQUENCY MODULE

(75) Inventor: Kunihiro Watanabe, Nagaokakyo (JP)

(73) Assignee: Murata Manufacturing Co., Ltd, Kyoto (JP)

( * ) Notice: Subject to any disclaimer, the term of this patent is extended or adjusted under 35 U.S.C. 154(b) by 0 days.

(21) Appl. No.: 12/109,521

(22) Filed: Apr. 25, 2008

(65) Prior Publication Data

US 2008/0191956 A1 Aug. 14, 2008

Related U.S. Application Data

(63) Continuation of application No. PCT/JP2006/311593, filed on Jun. 9, 2006.

(30) Foreign Application Priority Data

Oct. 27, 2005 (JP) .............................. 2005-312885

(51) Int. Cl.
*H01Q 1/38* (2006.01)
*H01Q 1/52* (2006.01)

(52) U.S. Cl. ............................. 343/700 MS; 343/841
(58) Field of Classification Search .......... 343/700 MS, 343/841, 846
See application file for complete search history.

(56) References Cited

U.S. PATENT DOCUMENTS

| 5,376,942 | A | 12/1994 | Shiga |
| 5,657,024 | A | 8/1997 | Shingyoji et al. |
| 5,940,036 | A * | 8/1999 | Oliver et al. ........ 343/700 MS |
| 6,646,609 | B2 | 11/2003 | Yuasa et al. |
| 6,809,688 | B2 * | 10/2004 | Yamada ................. 343/700 MS |
| 7,236,070 | B2 * | 6/2007 | Ajioka et al. ................ 333/247 |
| 2003/0030587 | A1 | 2/2003 | Yuasa et al. |
| 2005/0088260 | A1 | 4/2005 | Ajioka et al. |
| 2008/0266178 | A1 * | 10/2008 | Tiezzi et al. .......... 343/700 MS |

FOREIGN PATENT DOCUMENTS

| JP | 62-196903 | A | 8/1987 |
| JP | 04-170803 | A | 6/1992 |
| JP | 07-193423 | A | 7/1995 |
| JP | 09-064636 | A | 3/1997 |
| JP | 09-130136 | A | 5/1997 |
| JP | 2624159 | B2 | 6/1997 |
| JP | 10-4309 | A | 1/1998 |
| JP | 11-191715 | A | 7/1999 |
| JP | 11-340729 | A | 12/1999 |

(Continued)

OTHER PUBLICATIONS

Official communication issued in the International Application No. PCT/JP2006/311593, mailed on Sep. 19, 2006.

*Primary Examiner*—Shih-Chao Chen
(74) *Attorney, Agent, or Firm*—Keating & Bennett, LLP

(57) ABSTRACT

In a high-frequency module, an antenna device is disposed on a first principal surface of a second substrate, a first principal surface of a first substrate and a second principal surface of the second substrate face each other and are connected to each other by conductive connecting members, electronic components including an IC chip are mounted on the first principal surface of the first substrate, ground electrodes are disposed on the first and second substrates, the conductive connecting members are connected to a ground potential, and thus the IC chip is surrounded by the ground electrodes of the first and second substrates and the conductive connecting members.

19 Claims, 6 Drawing Sheets

FOREIGN PATENT DOCUMENTS

| | | |
|---|---|---|
| JP | 3002252 B2 | 1/2000 |
| JP | 2000-216630 A | 8/2000 |
| JP | 2001-298321 A | 10/2001 |
| JP | 2004-241857 A | 8/2004 |
| JP | 2005-019649 A | 1/2005 |

\* cited by examiner

HIGH-FREQUENCY MODULE

BACKGROUND OF THE INVENTION

1. Field of the Invention

The present invention relates to a high-frequency module defined by combining a plurality of devices including an antenna, and more particularly, to a high-frequency module having a structure in which a substrate provided with an antenna and another substrate provided with a high-frequency device are joined together.

2. Description of the Related Art

To reduce the size of communication equipment, such as mobile phones, various types of high-frequency modules defined by combining a plurality of devices including an antenna are used.

For example, Japanese Unexamined Patent Application Publication No. 2005-19649 discloses a high-frequency module illustrated in FIG. 12.

Referring to FIG. 12, a high-frequency module 101 has a laminated structure including a first dielectric substrate 103 having an antenna conductor 102 on an upper surface thereof, and a second dielectric substrate 104 having a recessed portion 104a in a lower surface thereof. A high-frequency device 105 and an antenna-characteristic measuring connector 106 are disposed in the recessed portion 104a.

A ground conductor 107 connected to a ground potential is disposed under substantially the entire lower surface of the first dielectric substrate 103. The ground conductor 107 has a through hole through which a through hole conductor 108 extends so as not to come into contact with the ground conductor 107. An upper end and a lower end of the through hole conductor 108 are connected to the antenna conductor 102 and the antenna-characteristic measuring connector 106, respectively.

In the high-frequency module 101, a terminal electrode 109 is disposed in a lower surface of a frame portion around the recessed portion 104a of the second dielectric substrate 104. The terminal electrode 109 is connected to a high-frequency circuit including the high-frequency device 105. Also, the terminal electrode 109 is connected to an electrode land 111 on a mounting board 110, with a conductive joining member 112 interposed between the terminal electrode 109 and the electrode land 111.

In the high-frequency module 101, the antenna-characteristic measuring connector 106 is disposed in the recessed portion 104a in the lower surface of the second dielectric substrate 104. Since the antenna-characteristic measuring connector 106 is disposed below the ground conductor 107, electromagnetic fields radiated from the antenna are not transmitted to the measuring probe. Therefore, Japanese Unexamined Patent Application Publication No. 2005-19649 states that it is possible to measure the antenna characteristics that are unaffected by the electromagnetic fields.

In the high-frequency module 101, the first dielectric substrate 103 having the antenna conductor 102 on the upper surface thereof and the second dielectric substrate 104 having the high-frequency device 105 on the lower surface thereof are directly stacked together to define an integrated unit.

At the same time, since the intensity of the radio waves radiated from the antenna including the antenna conductor 102 is relatively high, the radio waves propagate from above the antenna conductor 102 to the high-frequency circuit including the high-frequency device 105. Therefore, although the antenna conductor 102 and the high-frequency device 105 are separated from each other by the ground conductor 107, the radio waves from the antenna conductor 102 cause fluctuations in the characteristics of the high-frequency circuit including the high-frequency device 105. That is, although the ground conductor 107 is disposed above the high-frequency circuit including the high-frequency device 105, there is a tendency that radio waves from the antenna conductor 102 are partially transmitted around the ground conductor 107 and affect the high-frequency circuit including the high-frequency device 105.

SUMMARY OF THE INVENTION

To overcome the problems described above, preferred embodiments of the present invention provide a high-frequency module defined by combining a plurality of devices including an antenna to achieve compactness that is less susceptible to the adverse effect of radio waves radiated from the antenna, and thus having outstanding reception or transmission performance.

A high-frequency module according to a preferred embodiment of the present invention includes a first substrate having first and second principal surfaces and provided with a ground layer connected to a wiring layer and to a ground potential, a mounted component on the first principal surface of the first substrate, a second substrate having first and second principal surfaces and provided with a ground layer, and an antenna device on the first principal surface of the second substrate. The first principal surface of the first substrate and the second principal surface of the second substrate are disposed to face each other. The high-frequency module further includes a conductive connecting member connected to the ground potential and connecting the first principal surface of the first substrate and the second principal surface of the second substrate.

Preferably, the conductive connecting member is disposed around the mounted component.

Preferably, the conductive connecting member is a columnar member.

Alternatively, the conductive connecting member may be a plate-like member extending to connect the first and second substrates.

Preferably, more than one conductive connecting member is provided.

Preferably, signal terminals are provided which connect the principal surfaces of the first and second substrates and through which signal currents flow.

At least a portion of the conductive connecting member, other than portions connected to the first and second substrates, is preferably coated with an insulating material.

The insulating material preferably has a frame shaped member disposed around the mounted component, and the conductive connecting member is embedded in the frame shaped member.

Preferably, the insulating material is a synthetic resin.

The mounted component is preferably an active component.

The area of the ground layer in the second substrate is preferably greater than the area of the first principal surface of the first substrate.

Preferably, the first and second principal surfaces of the second substrate each have a ground layer disposed thereon.

The ground layer in the first substrate and the ground layer in the second substrate are preferably separated from each other.

The first principal surface of the second substrate is preferably provided with a coplanar line in addition to the antenna device.

Preferably, the permittivity of a material of which the second substrate is made is less than the permittivity of a material of which the first substrate is made.

The first substrate preferably includes a plurality of substrate layers, and a wiring layer is interposed between at least one pair of adjacent substrate layers of the plurality of substrate layers.

The ground layer is preferably interposed between at least one pair of adjacent substrate layers of the plurality of substrate layers.

The mounted component on the first principal surface of the first substrate is preferably sealed with a resin-sealing layer.

Preferably, a gap is created between an upper surface of the resin-sealing layer and the second principal surface of the second substrate.

In the high-frequency module according to preferred embodiments of the present invention, the mounted component is on the first principal surface of the first substrate and the antenna device is on the first principal surface of the second substrate. The first substrate and the second substrate are disposed such that the first principal surface of the first substrate and the second principal surface of the second substrate face each other, the second principal surface being opposite the first principal surface of the second substrate. The first principal surface of the first substrate and the second principal surface of the second substrate are connected to each other by the conductive connecting member.

The antenna device is disposed on the first principal surface of the second substrate having the ground layer. Therefore, the propagation of radio waves from the antenna device to the first substrate is blocked by the ground layer of the second substrate. Moreover, the first substrate and the second substrate are not directly stacked together and are disposed such that the first principal surface of the first substrate and the second principal surface of the second substrate face each other and are joined to each other by the conductive connecting member. Therefore, the effects of radio waves radiated from the antenna device on the mounted component are significantly reduced.

Additionally, the conductive connecting member, which is connected to the ground potential, also reduces the effects of radio waves radiated from the antenna on the mounted component.

Therefore, with preferred embodiments of the present invention, in the high-frequency module defined by combining a plurality of devices including the antenna and the mounted component, it is possible to reduce fluctuations in characteristics caused by radio waves radiated from the antenna and to effectively improve reception and transmission performance.

In particular, when the conductive connecting member is disposed around the mounted component, it is possible to more effectively reduce the effects of radio waves radiated from the antenna on the mounted component.

When the conductive connecting member is a columnar member, a gap can be created between the first and second substrates by connecting ends of the conductive connecting member to the first principal surface of the first substrate and the second principal surface of the second substrate, respectively. At the same time, by connecting the conductive connecting member to the ground potential, the gap can be reliably electromagnetically shielded.

When the conductive connecting member is a plate-like member extending to connect the first and second substrates, the inner region of the plate-like member can be more reliably electromagnetically shielded by connecting the plate-like member to the ground potential. Thus, the effects of radio waves radiated from the antenna can be further reduced.

When more than one conductive connecting member is provided, the effects of radio waves radiated from the antenna on the mounted component can be more effectively reduced.

When signal terminals which connect the principal surfaces of the first and second substrates and through which signal currents flow are provided, an electrical connection between the antenna device and the mounted component can be established by the signal terminals. In this case, it is only necessary to determine the number and arrangement of conductive connecting members such that the effect of radio waves radiated from the antenna on the mounted component can be reduced. Thus, since a higher degree of design freedom is achieved, it is easier to further reduce the effects of radio waves radiated from the antenna on the mounted component.

When at least a portion of the conductive connecting member, other than portions connected to the first and second substrates, is coated with an insulating material, it is possible to reduce short circuits and variations in characteristics caused by contact of conductive material and metal powders with the conductive connecting member. At the same time, it is possible to improve environmental resistance, such as moisture resistance.

When the insulating material is defined by a frame shaped member disposed around the mounted component and the conductive connecting member is embedded in the frame shaped member, the mounted component is reliably enclosed by the frame shaped member of insulating material. Therefore, it is possible to improve moisture resistance and environmental resistance. Additionally, since the conductive connecting member is disposed around the mounted component, fluctuations in characteristics caused by the effects of radio waves radiated from the antenna can be more reliably prevented. At the same time, since the permittivity of the frame shaped member is less than that of the first substrate, the resonance associated with a wavelength shortening effect occurs at frequencies greater than those used in the high-frequency module. Therefore, it is possible to reduce the degradation in the characteristics of the high-frequency module caused by the resonance.

When the insulating material is a synthetic resin, it is easy to form an insulating layer around the conductive connecting member.

When the mounted component is an active component, which is a very important component for providing a module function and high-frequency characteristics, the effects of the external environment, such as the antenna, on the active component must be minimized. Accordingly, when the active component is mounted in a region surrounded by the conductive connecting member and GND electrodes, the effects of electromagnetic fields radiated from the antenna on the active component can be effectively reduced. Thus, excellent and stable high-frequency characteristics can be achieved.

When the area of the ground layer in the second substrate is greater than the area of the first principal surface of the first substrate, the propagation of radio waves radiated from the antenna device to the first substrate can be more effectively suppressed.

When the first and second principal surfaces of the second substrate each have a ground layer thereon, it is possible to effectively reduce the effects of radio waves radiated from the antenna device on the mounted component disposed on the first substrate.

When the ground layer in the first substrate and the ground layer in the second substrate are separated from each other, the mounted component can be more effectively electromagnetically shielded by individually connecting these ground layers to the ground potential.

When the first principal surface of the second substrate is provided with a substantially coplanar line as well as the antenna device, the structure of the high-frequency module is substantially planar. Therefore, the size and profile of the high-frequency module can be reduced.

When the permittivity of a material of which the second substrate is made is less than the permittivity of a material of which the first substrate is made, the resonance associated with a wavelength shortening effect occurs at frequencies higher than those used in the high-frequency module. Therefore, it is possible to reduce degradation in the characteristics of the high-frequency module caused by the resonance.

When the first substrate includes a plurality of substrate layers, and a wiring layer is interposed between at least one pair of adjacent substrate layers of the plurality of substrate layers, the formation of a high-frequency circuit and higher-density wiring are facilitated. As a result, a large-scale high-frequency circuit can be constructed in a relatively small area.

When the ground layer is interposed between at least one pair of adjacent substrate layers of the plurality of substrate layers, it is possible to reduce the effects of radio waves on the mounted component disposed on the first substrate, the radio waves being transmitted to the lower surface of the first substrate. Thus, reception and transmission performance can be further improved.

When the mounted component on the first principal surface of the first substrate is sealed with a resin-sealing layer, it is possible to improve environmental resistance characteristics of the high-frequency module.

When a gap is created between an upper surface of the resin-sealing layer and the second substrate, the permittivity significantly changes in the region between the antenna device and the mounted component. At the same time, since a gap layer with very low permittivity is created, it is possible to more effectively reduce the effect of electromagnetic fields radiated from the antenna on the mounted component.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, the present invention will be described by explaining specific preferred embodiments of the present invention with reference to the drawings.

Figure 1A:
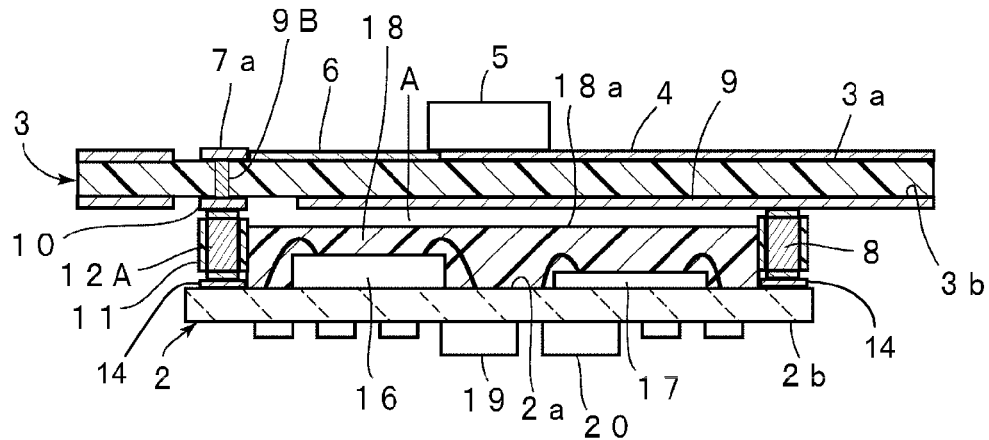
FIG. 1A and FIG. 1B are cross-sectional views illustrating a high-frequency module according to a preferred embodiment of the present invention and taken along respective lines A-A and B-B of FIG. 2.
Figure 1B:
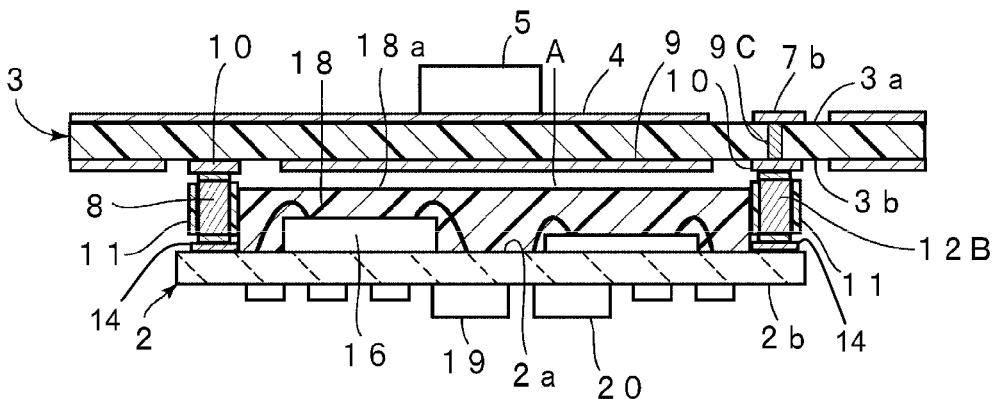

FIG. 1A and FIG. 1B are front cross-sectional views of a high-frequency module according to a preferred embodiment of the present invention. FIG. 1A is a cross-sectional view taken along line A-A of FIG. 2. FIG. 1B is a cross-sectional view taken along line B-B of FIG. 2. A high-frequency module 1 includes a first substrate 2 and a second substrate 3. The first substrate 2 has an upper surface 2a defining a first principal surface and a lower surface 2b defining a second principal surface.

The first substrate 2 is made of dielectric ceramic material having a permittivity greater than that of the second substrate 3.

The second substrate 3 is made of synthetic resin material having a relatively low permittivity. Examples of such synthetic resin materials include, but are not specifically limited to, polyimide resin, epoxy resin, and glass epoxy resin.

Figure 2:
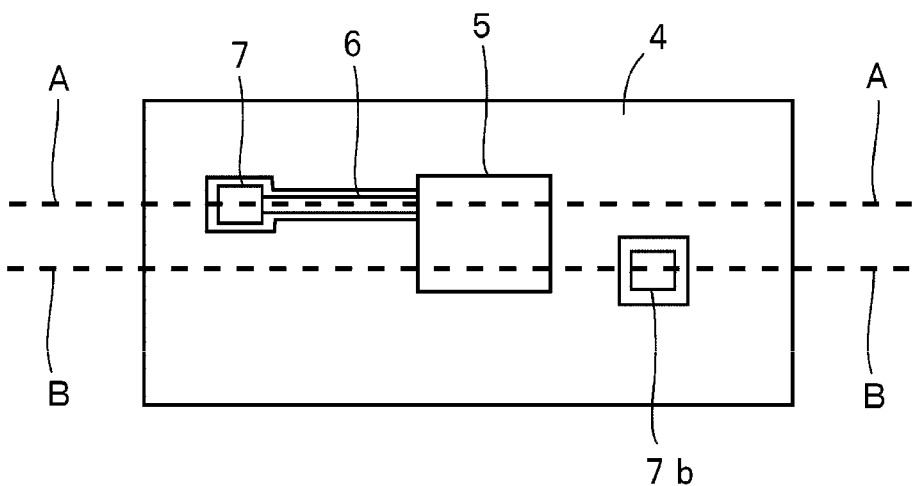
FIG. 2 is a schematic plan view illustrating an electrode structure on an upper surface of a first substrate used in the preferred embodiment illustrated in FIGS. 1A and 1B.

As illustrated in the schematic plan view of FIG. 2, a ground electrode 4 is provided, as a ground layer, over substantially an entire upper surface 3a defining a first principal surface of the second substrate 3.

An antenna device 5 is mounted on the upper surface 3a of the second substrate 3. The antenna device 5 is connected to one end of an L-shaped coplanar line 6 on the upper surface 3a. The other end of the coplanar line 6 is connected to an electrode pad 7a.

The electrode pad 7a is connected to a through hole electrode 9B, which is connected to an RF terminal 12A defining a signal terminal.

An electrode pad 7b is disposed on the upper surface 3a of the second substrate 3. The electrode pad 7b is connected to a through hole electrode 9C, which is connected to a bias terminal 12B defining a signal terminal.

The antenna device 5 may be any appropriate antenna device, such as a dielectric antenna.

The ground electrode 4 and the coplanar line 6 can be formed by coating the upper surface 3a of the substrate 3 with appropriate metallic material, such as Al or Cu, and patterning the coated upper surface 3a. Although the coplanar line 6 preferably has a substantially L-shaped configuration in the present preferred embodiment, the shape of the coplanar line 6 is not specifically limited thereto.

In the present preferred embodiment, the first substrate 2 is connected to a lower surface 3b defining a second principal surface of the second substrate 3 by a plurality of conductive connecting members 8. That is, the lower surface 3b of the second substrate 3 and the upper surface 2a of the first substrate 2 are connected to each other by the conductive connecting members 8.

Figure 3:
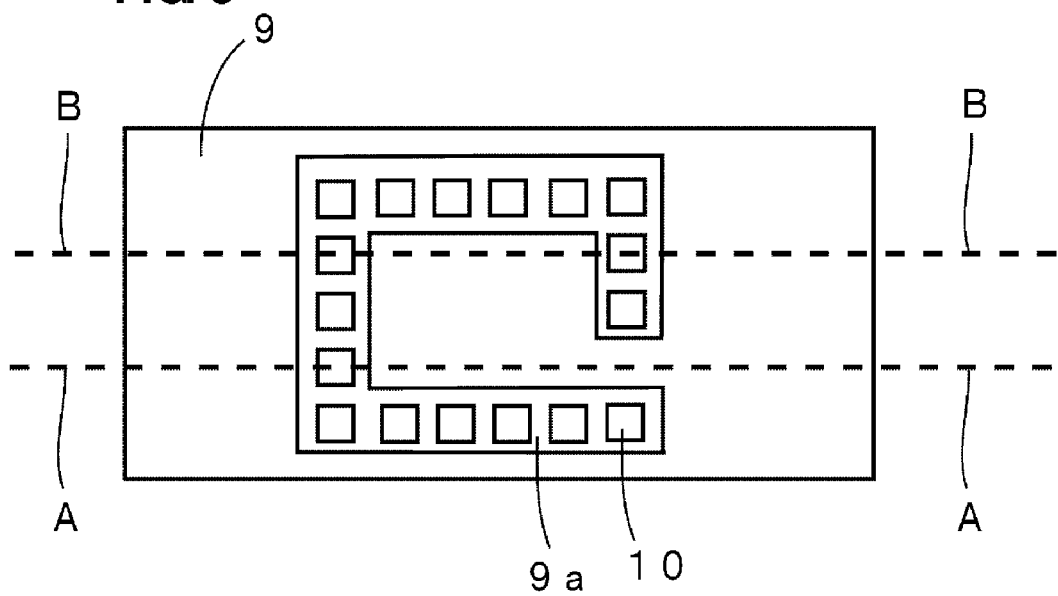
FIG. 3 is a schematic bottom view illustrating an electrode structure on a lower surface of the first substrate used in the preferred embodiment illustrated in FIGS. 1A and 1B.

As illustrated in the bottom view of FIG. 3, a ground electrode 9 is on the lower surface 3b of the second substrate 3.

Figure 4:
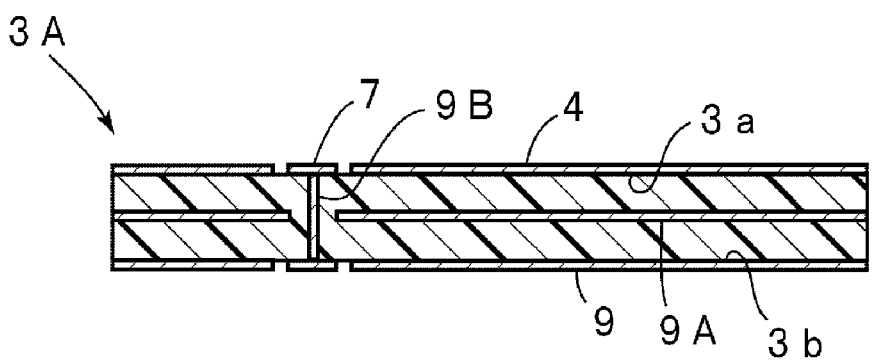
FIG. 4 is a front cross-sectional view illustrating a detail of the first substrate used in the preferred embodiment illustrated in FIGS. 1A and 1B.

As illustrated in FIG. 4, in addition to the ground electrode 4 and the ground electrode 9 provided on the respective upper and lower surfaces of the second substrate 3, a ground electrode 9A may be provided in a central portion of the second substrate 3. Here, an electrode pad 7 connected to the coplanar line 6 is electrically connected to a wiring layer including the through hole electrode 9B extending outward to the upper surface so as not to come into contact with the ground electrode 9A. The wiring layer including the through hole electrode 9B is connected to a high-frequency circuit (described below) by a signal terminal (described below).

Referring back to FIG. 3, the ground electrode 9 includes an opening 9a, in which the plurality of conductive connecting members 8 are connected to corresponding electrode pads 10 on the lower surface 3b of the second substrate 3.

Figure 5:
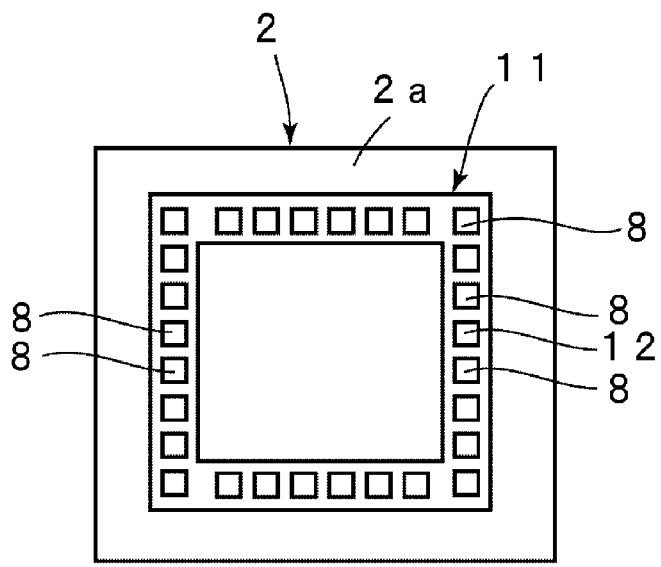
FIG. 5 is a schematic plan view illustrating a structure in which a frame shaped member is disposed on a second substrate used in the preferred embodiment illustrated in FIGS. 1A and 1B.

In the present preferred embodiment, the plurality of conductive connecting members 8 are embedded in a rectangular or substantially rectangular frame shaped member 11 made of synthetic resin. That is, as illustrated in the plan view of FIG. 5, the frame shaped member 11 is secured to the upper surface 2a of the first substrate 2. The plurality of rectangular columnar conductive connecting members 8 are embedded in the frame shaped member 11. The upper end and lower end of each conductive connecting member 8 protrude upward and downward from the upper and lower surfaces, respectively, of the frame shaped member 11 made of synthetic resin. It is only necessary for the upper end and lower end of each conductive connecting member 8 to be exposed from at least the upper and lower surfaces, respectively, of the frame shaped member 11. As illustrated in FIGS. 1A and 1B, the upper ends of the conductive connecting members 8 are electrically connected to the corresponding electrode pads 10.

The electrode pads 10 may be electrically connected to the ground electrode 9. The conductive connecting members 8 are electrically connected to the ground potential as described below. As described below, the conductive connecting members 8 are electrically connected to the ground potential.

In the present preferred embodiment, signal terminals 12 in addition to the conductive connecting members 8 are embedded in the frame shaped member 11. Similar to the conductive connecting members 8, the signal terminals 12 each preferably have a rectangular columnar shape and protrude upward and downward from the upper and lower surfaces, respectively, of the frame shaped member 11. That is, the plurality of conductive connecting members 8 and the RF terminal 12A and the bias terminal 12B defining signal terminals are embedded in a similar manner in the frame shaped member 11.

The upper end of the RF terminal 12A is electrically connected to the electrode pad 7 electrically connected to the coplanar line 6. The RF terminal 12A electrically connects the antenna device 5 to the high-frequency circuit (described below) so as to allow a signal current to flow.

On the other hand, the plurality of conductive connecting members 8 are connected to the ground potential and electromagnetically shield a region surrounded by the frame shaped member 11.

Examples of synthetic resins of which the frame shaped member 11 is made include, but are not specifically limited to, polyimide resin, epoxy resin, and glass epoxy resin.

As illustrated in FIGS. 1A and 1B, the lower ends of the conductive connecting members 8 are connected to the first substrate 2. Specifically, the lower ends of the conductive connecting members 8 are connected to corresponding electrode pads 14 on the upper surface 2a of the first substrate 2. The connection method is not limited to a specific one. The conductive connecting members 8 may be connected to the corresponding electrode pads 14 with conductive joining material, such as solder.

The conductive connecting members 8 allow connection between the upper surface of the first substrate and the lower surface of the second substrate. This means that the conductive connecting members 8 mechanically connect the first and second substrates. In other words, the conductive connecting members 8 do not necessarily have to electrically connect an electrode or the like of the first substrate 2 and that of the second substrate 3. That is, as long as the conductive connecting members 8 are connected to the ground potential, the conductive connecting members 8 do not have to be capable of electrically connecting the first substrate 2 and the second substrate 3.

The electrode pads 14 are connected to the ground potential. This allows the plurality of conductive connecting members 8 to be electrically connected to the ground potential.

An IC chip 16 and a high-frequency device 17 are mounted on the upper surface 2a of the first substrate 2. The IC chip 16 and the high-frequency device 17 each correspond to a mounted component. Of these mounted components, the IC chip 16 corresponds to an active component. When the mounted component is an active component, which is a very important component for providing a module function and high-frequency characteristics, the effect of the external environment, such as the antenna, on the active component must be effectively reduced. Accordingly, when the active component is mounted in a region surrounded by the conductive connecting members and GND electrodes, the effects of electromagnetic fields radiated from the antenna on the active component can be effectively reduced. Thus, outstanding and stable high-frequency characteristics can be achieved.

The IC chip 16 and the high-frequency device 17 are electrically connected to electrodes (not shown) on the upper surface of the first substrate 2 by wire bonding. The IC chip 16 and the high-frequency device 17 are resin-molded by a resin-coating layer 18. Since the IC chip 16 and the high-frequency device 17 are resin-molded by the resin-coating layer 18, environmental resistance characteristics of the high-frequency circuit including the IC chip 16 and the high-frequency device 17 are improved. The resin-coating layer 18 may be made of any suitable resin material, such as epoxy resin or silicon resin.

An upper surface 18a of the resin-coating layer 18 is located under the second substrate 3 and a gap A. Since the gap A is provided, the permittivity significantly changes in the region from the second substrate 3 to the gap A, and the permittivity in the gap A is extremely small. Therefore, even if electromagnetic fields radiated from the side of the antenna device 5 and coplanar line 6 propagate downward, the effects of the electromagnetic fields on the high-frequency circuit including the IC chip 16 can be reduced. Therefore, it is preferable that the height of the resin-coating layer 18 be less than the distance between the first and second substrates 2 and 3 so that the gap A is created therebetween.

Electronic component devices 19 and 20 are mounted on the lower surface 2b of the first substrate 2. In the present preferred embodiment, the high-frequency circuit includes the IC chip 16 and a high-frequency device 17 mounted on the upper surface 2*a* of the first substrate 2 and the electronic component devices 19 and 20 mounted on the lower surface 2*b* of the first substrate 2. Since the electronic component devices 19 and 20 can be mounted on both the upper surface 2*a* and lower surface 2*b* of the first substrate 2, the size of the high-frequency module 1 can be reduced.

Although the electronic component devices 19 and 20 are surface-mounted with solder or other suitable conductive adhesive, they may be mounted on the lower surface 2*b* of the first substrate 2 via bonding wires, as in the case of the IC chip 16.

Figure 6:
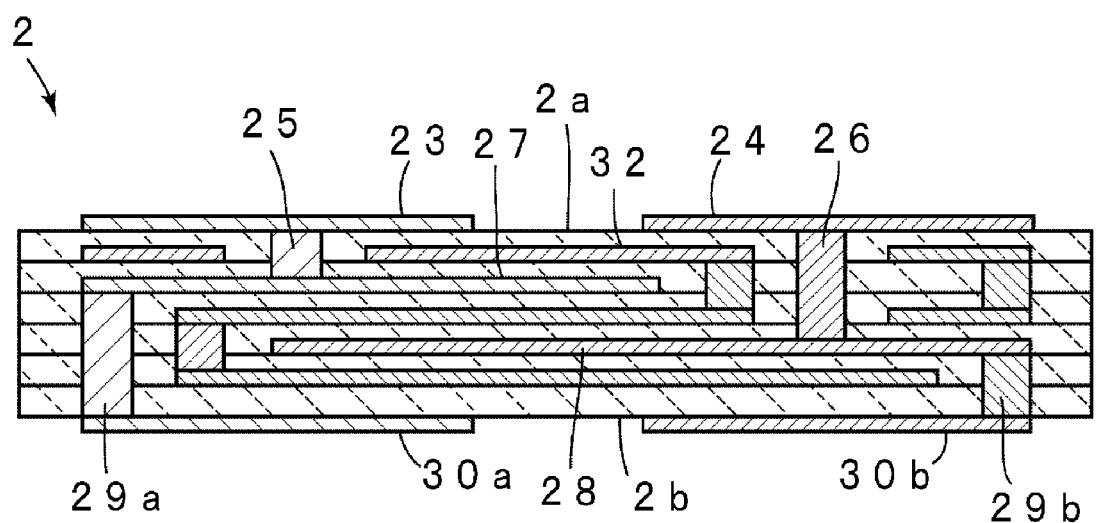
FIG. 6 is a front cross-sectional view illustrating the second substrate used in the preferred embodiment illustrated in FIGS. 1A and 1B.

FIG. 6 is a detailed cross-sectional view illustrating an exemplary structure of the first substrate 2, which is schematically illustrated in FIGS. 1A and 1B.

In the present preferred embodiment, the first substrate 2 is a multilayer substrate formed by stacking and co-firing a plurality of ceramic layers. Preferably, the first substrate 2 is a low-temperature fired multilayer substrate in which at least one of a plurality of dielectric ceramic layers is a contraction suppressing layer. With such a low-temperature fired multilayer substrate having a contraction suppressing layer, it is possible to form wiring that has outstanding stability and precision. The first substrate 2 may be a single layer. The material of the first substrate 2 is not specifically limited to a dielectric ceramic.

As illustrated in FIG. 6, ground electrodes 23 and 24 are disposed on the upper surface 2*a* of the first substrate 2. The ground electrode 23 is electrically connected through a through hole electrode 25 to an internal ground electrode 27, while the ground electrode 24 is electrically connected through a through hole electrode 26 to an internal ground electrode 28. The ground electrode 27 is electrically connected through a through hole electrode 29*a* to a ground electrode 30*a* on the lower surface 2*b* of the first substrate 2, while the ground electrode 28 is electrically connected through a through hole electrode 29*b* to a ground electrode 30*b* on the lower surface 2*b* of the first substrate 2. Thus, the first substrate 2 also has a ground layer.

Besides the electrodes connected to the ground potential described above, an internal electrode 32 is provided inside the first substrate 2. Internal electrodes including the internal electrode 32 electrically connect the IC chip 16 and high-frequency device 17 to the electronic component devices 19 and 20 mounted on the lower surface 2*b* of the first substrate 2, thereby forming the high-frequency circuit. In other words, a wiring layer of the high-frequency circuit is included in the first substrate 2.

In the high-frequency module 1 of the present preferred embodiment, the ground electrodes 4 and 9 are disposed on the upper surface 3*a* and lower surface 3*b* of the second substrate 3, respectively. Therefore, electromagnetic fields caused by radio waves radiated from the antenna device 5 do not significantly affect the region of the high-frequency circuit below the lower surface of the second substrate 3.

The ground electrodes 4 and 9 include openings through which electromagnetic waves from the antenna device 4 propagate. Additionally, radio waves from the antenna device 5 may propagate along the exterior of the first substrate 2 to the region of the high-frequency circuit underneath.

However, in the present preferred embodiment, the plurality of conductive connecting members 8 are spaced along the frame shaped member 11. At the same time, since the plurality of conductive connecting members 8 are connected to the ground potential, the region where the IC chip 16 and the high-frequency device 17 are disposed is electromagnetically shielded. Therefore, it is possible to reduce fluctuations in characteristics caused by propagation of radio waves along the exterior of the first substrate 2.

Additionally, since the first substrate 2 includes the ground electrodes 23 and 24 defining ground layers, a circuit region where the IC chip 16 and the high-frequency device 17 are provided is reliably electromagnetically shielded by the ground electrodes in the first substrate 2, the ground electrodes 4 and 9 in the second substrate, and the conductive connecting members 8. Thus, fluctuations in characteristics caused by radio waves radiated from the antenna device 5 are reliably prevented, and, at the same time, it is possible to achieve stable and outstanding reception and transmission performance.

Moreover, in the present preferred embodiment, creating the gap A makes it possible to reduce the effects of radio waves from the antenna device 5 on the high-frequency circuit.

The permittivity of the second substrate 3 made of synthetic resin is less than that of the first substrate 2 made of dielectric material. Since the second substrate 3 having a lower permittivity includes wiring which electrically connects the antenna device 5 to the high-frequency circuit, the resonance frequency associated with a wavelength shortening effect determined by the permittivity increases. This prevents degradation in characteristics of the high-frequency module 1. That is, since the resonance associated with the wavelength shortening effect occurs at frequencies greater than those used in the high-frequency module 1, it is possible to prevent the resonance from degrading the characteristics of the high-frequency module 1.

Additionally, since the coplanar line 6 connected to the antenna device 5 is surrounded by the ground electrode 4 and is planar in shape, very few radio waves are radiated from the coplanar line 6. Thus, it is possible to prevent the electromagnetic waves from degrading the characteristics of the high-frequency module 1. The transmission line connected to the antenna device 5 is not limited to the coplanar line 6.

Although the plurality of conductive connecting members 8 and the signal terminals 12 are embedded in the frame shaped member 11 in the present preferred embodiment, various modifications can be made to the arrangement of the conductive connecting members 8 and signal terminals 12.

Figure 7A:
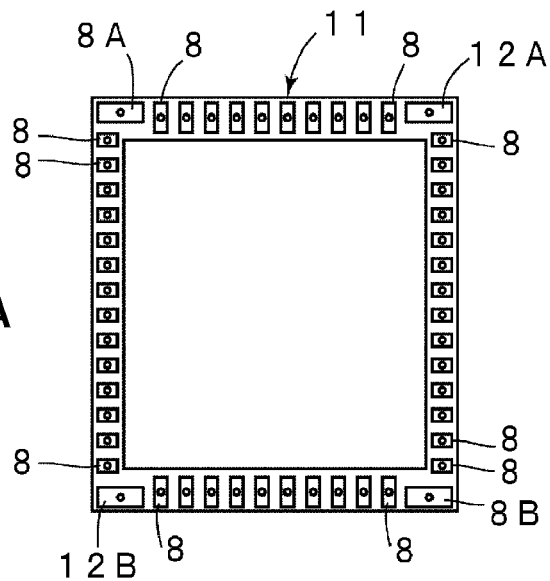
FIG. 7A, FIG. 7B, and FIG. 7C are schematic plan views illustrating modified arrangements of conductive connecting members and terminal electrodes embedded in the frame shaped member.
Figure 7B:
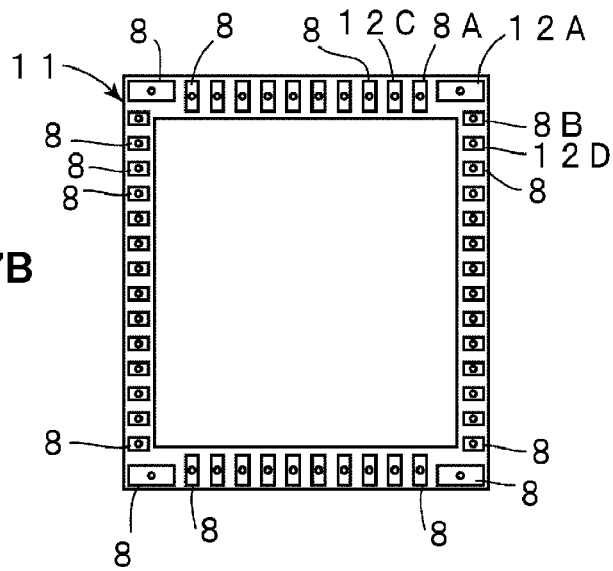
Figure 7C:
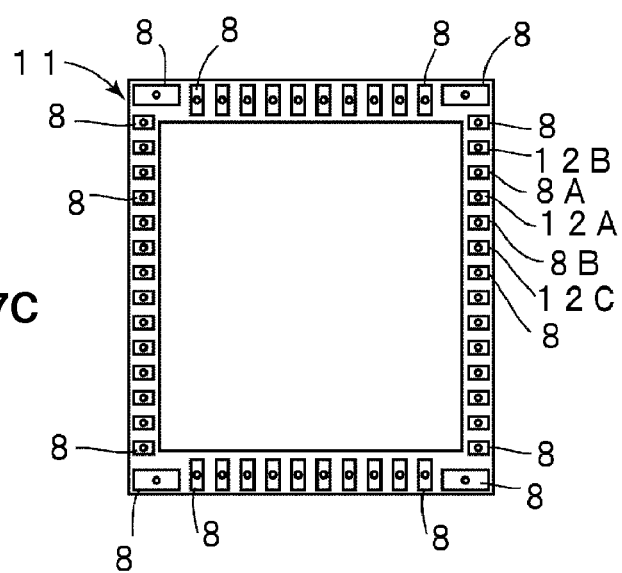

FIG. 7A to FIG. 7C are schematic plan views each illustrating a modified arrangement of the signal terminals and the conductive connecting members connected to the ground potential in the frame shaped member 11. Referring to FIG. 7A, conductive connecting members 8A and 8B connected to the ground potential are disposed at a pair of opposite corners of the rectangular frame shaped member 11. The RF terminal 12A defining a signal terminal is embedded at one of the two remaining corners, while the bias terminal 12B defining a signal terminal is embedded at the other of the two remaining corners. At the same time, the plurality of conductive connecting members 8 are spaced along each side of the frame shaped member 11.

Referring to FIG. 7B, the RF terminal 12A is disposed at one of the four corners of the frame shaped member 11, while the conductive connecting members 8A and 8B connected to the ground potential are disposed on both sides of the RF terminal 12A. At the same time, a bias terminal 12C defining a signal terminal is disposed adjacent to the RF terminal 12A with the conductive connecting member 8A interposed therebetween, while a bias terminal 12D defining a signal terminal is disposed adjacent to the RF terminal 12A with the conductive connecting member 8B interposed therebetween. Additionally, the conductive connecting members 8 are embedded in the remaining portion of the frame shaped member 11. Thus, in the structure illustrated in FIG. 7B, the signal terminals are disposed at one corner of the frame shaped member.

Referring to FIG. 7C, the RF terminal 12A defining a signal terminal is disposed on one side and near one corner of the frame shaped member 11, while the conductive connecting members 8A and 8B connected to the ground potential are disposed on both sides of the RF terminal 12A. At the same time, the bias terminal 12B is disposed adjacent to the RF terminal 12A with the conductive connecting member 8A interposed therebetween, while the bias terminal 12C is disposed adjacent to the RF terminal 12A with the conductive connecting member 8B interposed therebetween. Additionally, the conductive connecting members 8 are embedded in the remaining portion of the frame shaped member 11. That is, in the structure illustrated in FIG. 7C, a plurality of signal terminals are disposed on one side of the rectangular frame shaped member 11. Some of the plurality of conductive connecting members 8 may be connected to the ground potential.

As illustrated in FIG. 7A to FIG. 7C, various modifications can be made to the arrangement of the plurality of signal terminals and conductive connecting members in the frame shaped member 11. However, as illustrated in FIG. 7A to FIG. 7C, it is preferable that a conductive connecting member 8 connected to the ground potential be interposed between an RF terminal and a bias terminal so that interference between a signal passing through the bias terminal and a signal passing through the RF terminal can be suppressed.

In other words, it is preferable that conductive connecting members connected to the ground potential be disposed around signal terminals so that the signal terminals through which different signals pass are not immediately adjacent to each other.

Figure 8:
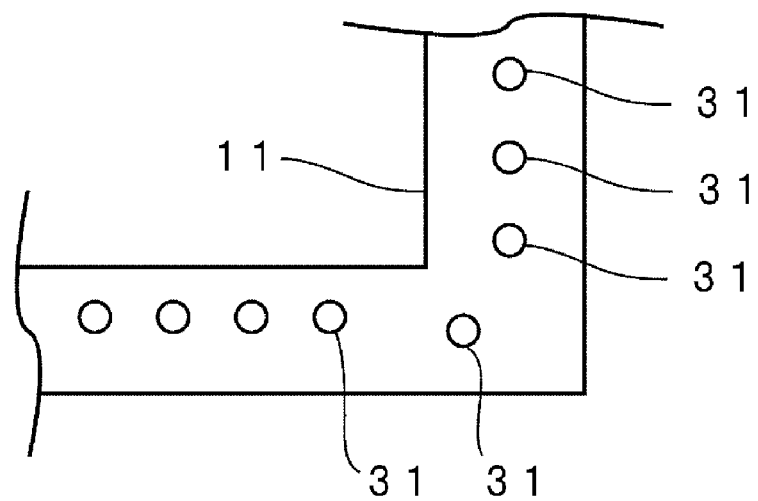
FIG. 8 is a schematic partially cutaway plan view illustrating a modified shape of conductive connecting members.

In the present preferred embodiment, the conductive connecting members embedded in the frame shaped member 11 preferably have a substantially rectangular columnar shape. However, as illustrated in the schematic partially cutaway plan view of FIG. 8, substantially circular columnar conductive connecting members 31 may be embedded in the frame shaped member 11. In other words, the conductive connecting members may have either a substantially rectangular or a substantially circular columnar shape. Likewise, the signal terminals may have a substantially circular columnar shape.

Although the plurality of conductive connecting members 8 and the signal terminals 12 are embedded in the frame shaped member 11 in the preferred embodiments described above, signal terminals may be separately provided outside the frame shaped member 11.

Figure 9:
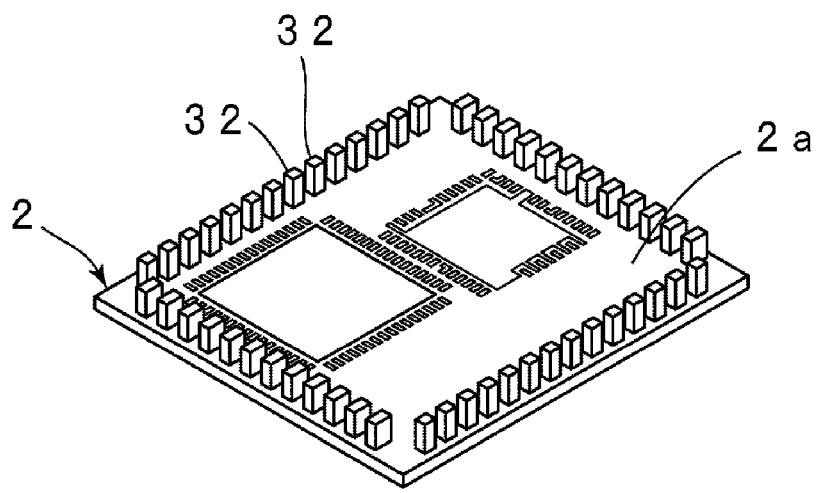
FIG. 9 is a perspective view illustrating a modified structure in which a plurality of conductive connecting members are disposed on the substrate.
Figure 10:
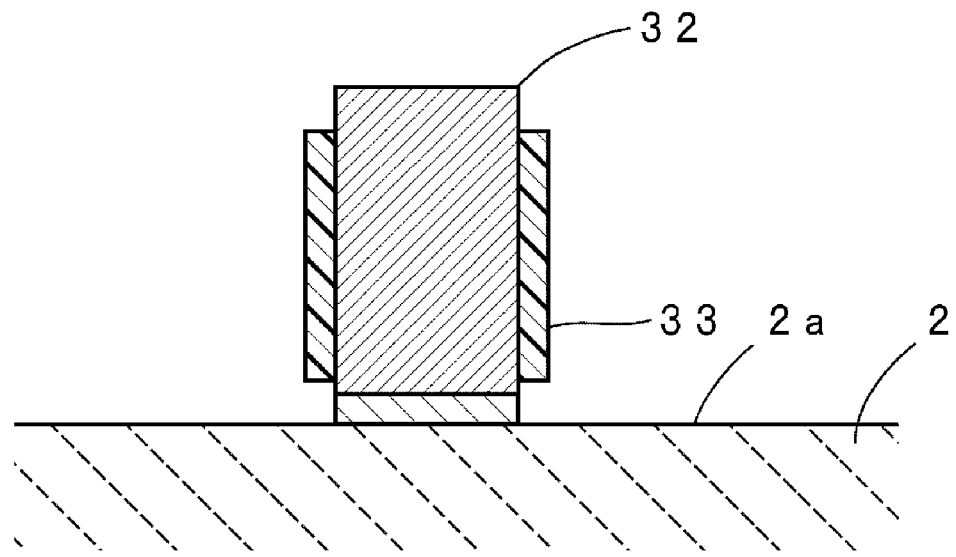
FIG. 10 is an enlarged partially cutaway front cross-sectional view illustrating a modified structure in which a plurality of conductive connecting members are disposed on the substrate.

The plurality of conductive connecting members 8 are embedded in the frame shaped member 11 in the preferred embodiments described above. However, as illustrated in the perspective view of FIG. 9, a plurality of conductive connecting members 32 may be vertically disposed on the upper surface 2a of the first substrate 2. In this case, as illustrated in FIG. 10, each conductive connecting member 32 is connected to an electrode land on the upper surface 2a of the first substrate 2 with conductive joining material. Alternatively, the conductive connecting members 32 may be configured to protrude from one principal surface of the first substrate. That is, the conductive connecting members 32 may be formed by stacking, on one principal surface of the first substrate, ceramic green sheets that are not sintered at a firing temperature of the first substrate and have conductive components at locations where conductive connecting members are to be formed, firing the stacked ceramic green sheets at the firing temperature of the first substrate, and removing the unsintered ceramic green sheets. In other words, the conductive connecting members 32 may be made of sintered metal prepared by co-sintering with the first substrate. The exterior of the conductive connecting members 32 may be coated with synthetic resin. The conductive connecting members 32 may be continuously coated in a frame shaped manner, or the plurality of conductive connecting members 8 may be individually coated with a resin-coating layer 33.

Figure 11:
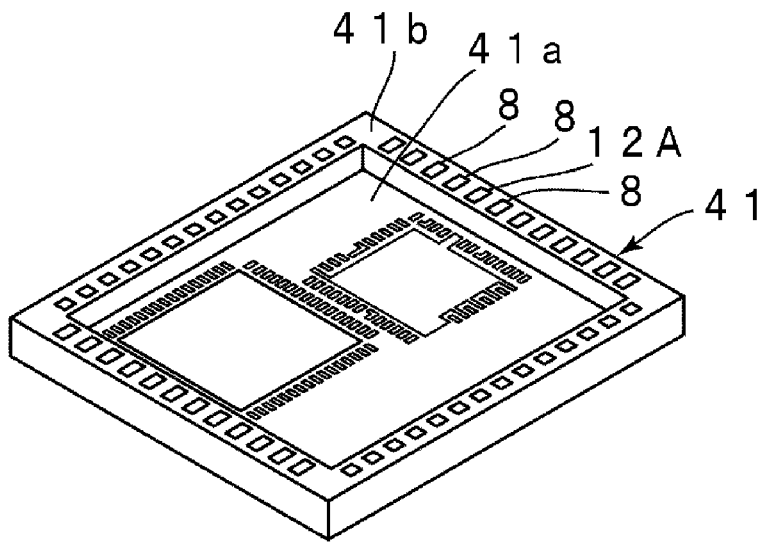
FIG. 11 is a perspective view illustrating a modified structure in which conductive connecting members are disposed in the second substrate.
Figure 12:
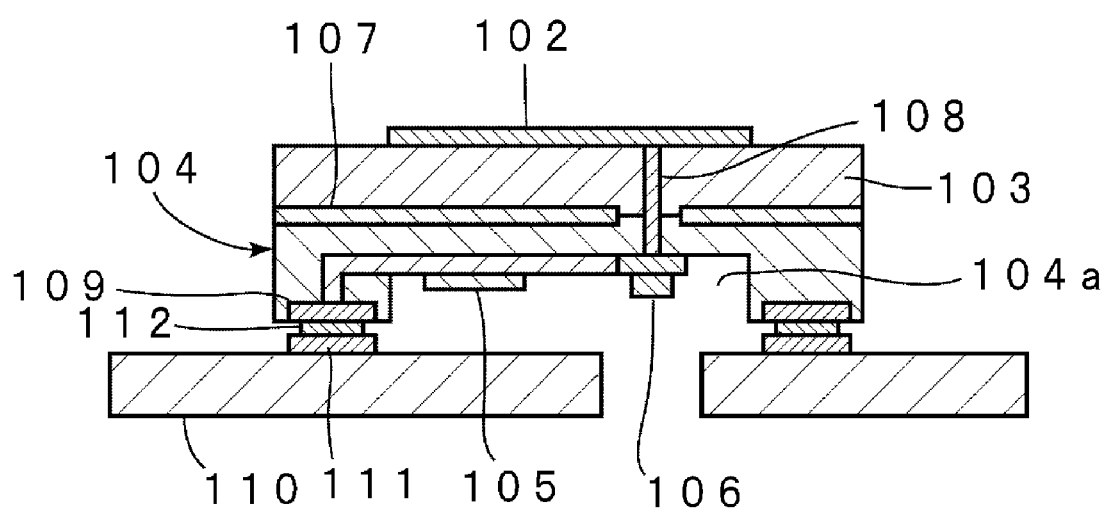
FIG. 12 is a front cross-sectional view illustrating a conventional high-frequency module.

In the preferred embodiment illustrated in FIGS. 1A and 1B, a planar dielectric substrate is provided as the first substrate 2. Alternatively, as illustrated in FIG. 11, a first substrate 41 having a recessed portion 41a in an upper surface thereof may be provided. The recessed portion 41a is provided in the upper surface defining a first principal surface of the first substrate 41. The recessed portion 41a is surrounded by a frame-shaped step portion 41b. A plurality of conductive connecting members 8 and at least one RF terminal 12A are embedded in the step portion 41b. In other words, the step portion 41b has a structure similar to that of the frame shaped member 11 of the above-described preferred embodiments.

That is, the first substrate 41 of the present modification is a combination of the frame shaped member 11 and the first substrate 2, which are made of a dielectric ceramic. The conductive connecting members 8 are exposed on the upper surface of the step portion 41b. The conductive connecting members 8 connect the upper surface of the first substrate 41 to the lower surface 3b of the second substrate 3 illustrated in FIGS. 1A and 1B.

That is, when the first principal surface of the first substrate 41 includes the recessed portion 41a, since the recessed portion 41a is in the first principal surface, the step portion 41b defines a portion of the first principal surface. Thus, in the present modification, the conductive connecting members 8 connect the second principal surface of the second substrate and the first principal surface of the first substrate.

Therefore, in preferred embodiments of the present invention, the conductive connecting members 8 can be provided in the first substrate 41 as long as they connect the first principal surface of the first substrate and the second principal surface of the second substrate.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A high-frequency module comprising:
   a first substrate having first and second principal surfaces and provided with a ground layer connected to a wiring layer and to a ground potential;
   a mounted component disposed on the first principal surface of the first substrate;
   a second substrate having first and second principal surfaces and provided with a ground layer disposed on the first principal surface; and
   an antenna device disposed on the first principal surface of the second substrate with the ground layer disposed therebetween; wherein
   the first principal surface of the first substrate and the second principal surface of the second substrate are arranged to face each other; and
   the high-frequency module further comprises a conductive connecting member connected to the ground potential and connecting the first principal surface of the first substrate and the second principal surface of the second substrate.

2. The high-frequency module according to claim 1, wherein the conductive connecting member is disposed around a periphery of the mounted component.

3. The high-frequency module according to claim 1, wherein the conductive connecting member is a columnar member.

4. The high-frequency module according to claim 1, wherein the conductive connecting member is a plate shaped member arranged to connect the first and second substrates.

5. The high-frequency module according to claim 1, wherein at least two conductive connecting members are provided.

6. The high-frequency module according to claim 1, further comprising signal terminals connecting the principal surfaces of the first and second substrates and through which signal currents flow.

7. The high-frequency module according to claim 1, wherein at least a portion of the conductive connecting member, other than portions connected to the first and second substrates, is coated with an insulating material.

8. The high-frequency module according to claim 7, wherein the insulating material is defined by a frame shaped member disposed around the mounted component, and the conductive connecting member is embedded in the frame shaped member.

9. The high-frequency module according to claim 7, wherein the insulating material is a synthetic resin.

10. The high-frequency module according to claim 1, wherein the mounted component is an active component.

11. The high-frequency module according to claim 1, wherein an area of the ground layer in the second substrate is greater than an area of the first principal surface of the first substrate.

12. The high-frequency module according to claim 1, wherein each of the first and second principal surfaces of the second substrate includes a ground layer disposed thereon.

13. The high-frequency module according to claim 1, wherein the ground layer in the first substrate and the ground layer in the second substrate are separated from each other.

14. The high-frequency module according to claim 1, wherein the first principal surface of the second substrate is provided with a coplanar line in addition to the antenna device.

15. The high-frequency module according to claim 1, wherein the second substrate is made of a material having a permittivity less than a permittivity of a material from which the first substrate is made.

16. The high-frequency module according to claim 1, wherein the first substrate includes a plurality of substrate layers, and a wiring layer is interposed between at least one pair of adjacent substrate layers of the plurality of substrate layers.

17. The high-frequency module according to claim 16, wherein the ground layer is interposed between at least one pair of adjacent substrate layers of the plurality of substrate layers.

18. The high-frequency module according to claim 1, wherein the mounted component on the first principal surface of the first substrate is sealed with a resin-sealing layer.

19. The high-frequency module according to claim 18, wherein a gap is provided between an upper surface of the resin-sealing layer and the second principal surface of the second substrate.

* * * * *